United States Patent [19]

Hanafin

[11] 4,321,419
[45] Mar. 23, 1982

[54] SOLAR PANEL COVER ASSEMBLY

[76] Inventor: Maurice C. Hanafin, 378 Rockgreen Pl., Santa Rosa, Calif. 95405

[21] Appl. No.: 104,116

[22] Filed: Dec. 17, 1979

Related U.S. Application Data

[63] Continuation of Ser. No. 875,986, Feb. 8, 1978, abandoned.

[51] Int. Cl.³ .......................... H01L 31/04; F24J 3/02
[52] U.S. Cl. .................................... 136/251; 126/418; 126/450; 136/244
[58] Field of Search ................ 160/241, 242; 136/244, 136/251, 259; 126/417, 418, 419, 426, 450

[56] References Cited

U.S. PATENT DOCUMENTS 2,271,099 1/1942 Schur ................................. 160/241
4,097,308 6/1978 Klein et al. ........................ 136/251

Primary Examiner—Aaron Weisstuch
Attorney, Agent, or Firm—Flehr, Hohbach, Test

[57] ABSTRACT

The invention provides a transparent protective cover for a solar panel. The cover provides for the positioning of lengths of clean covering film over the solar panel thereby removing dust and other accumulations. A pair of rollers on opposite sides of the solar panel support a supply of film material which extends over the panel surface. Clean film material is advanced at a predetermined rate across the solar panel thereby continuously replacing the panel cover and preventing excessive dust accumulation.

11 Claims, 6 Drawing Figures

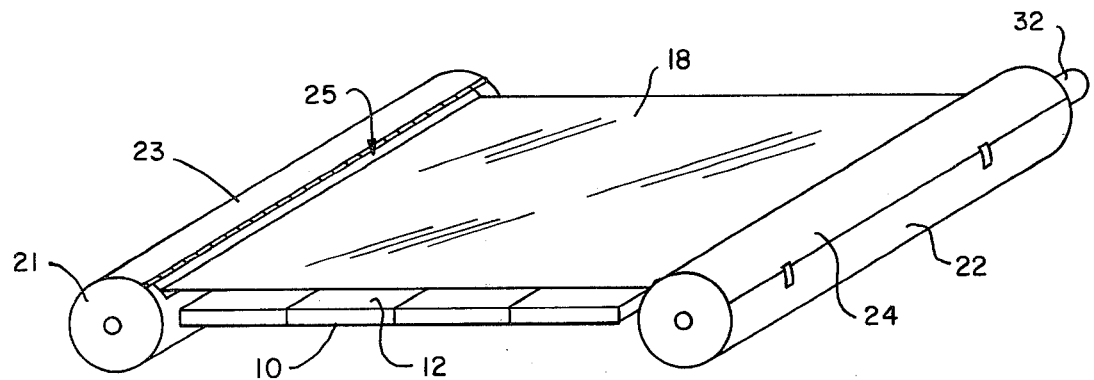
FIG.—1
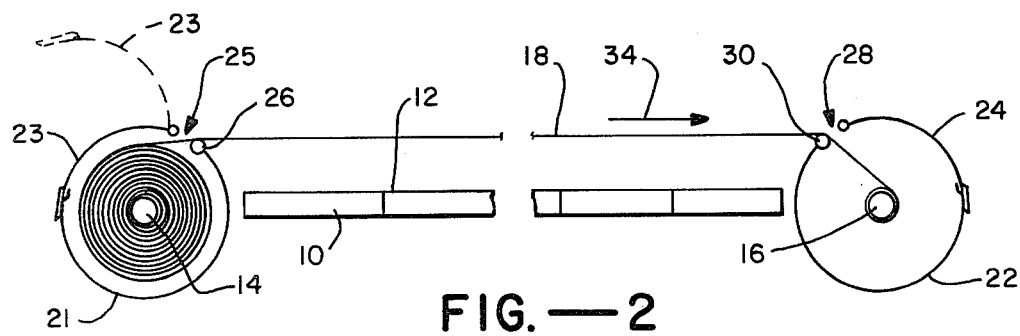
FIG.—2
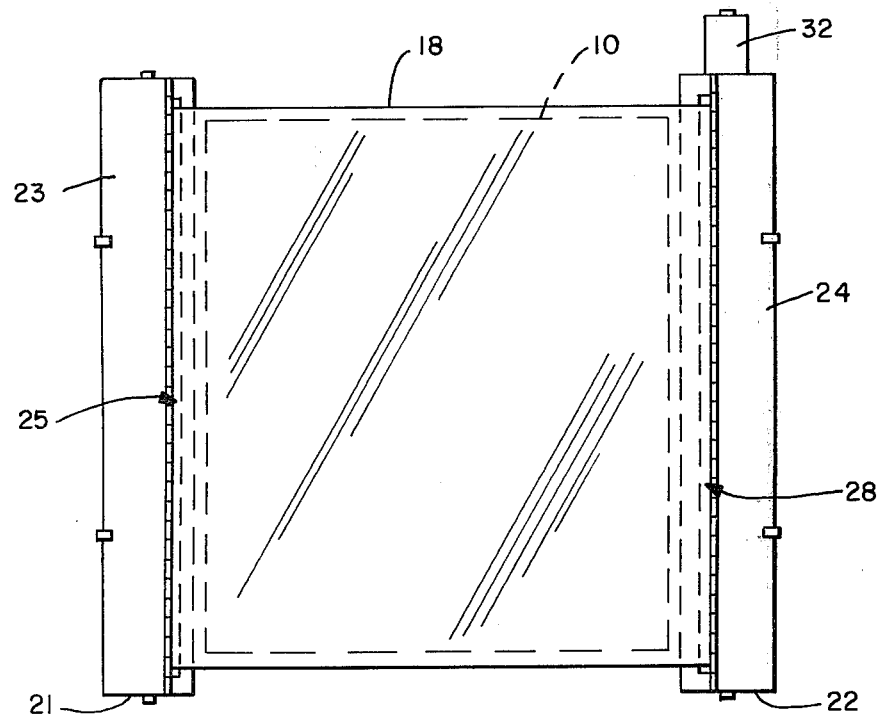
FIG.—3

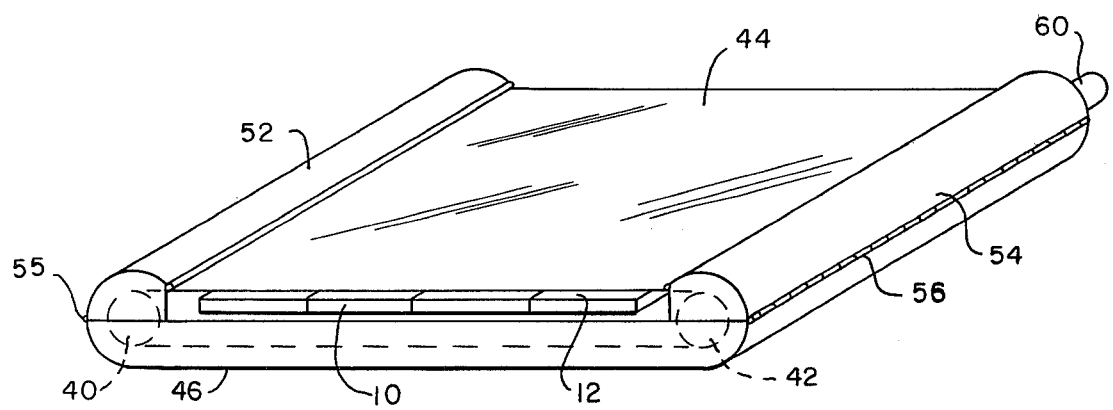
FIG.—4
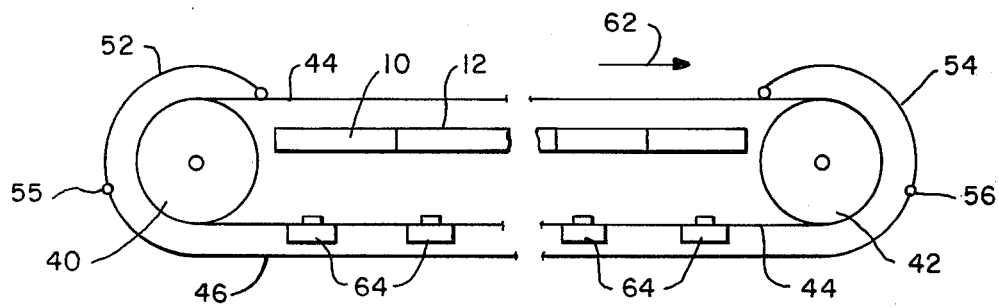
FIG.—5
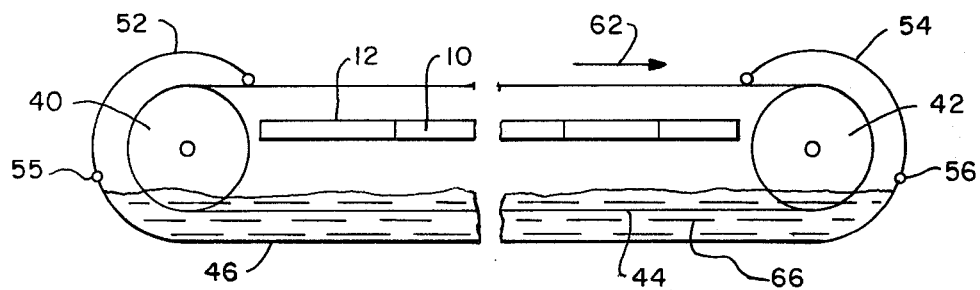
FIG.—6

SOLAR PANEL COVER ASSEMBLY

This is a continuation of application Ser. No. 875,986, filed Feb. 9, 1978, abandoned.

BACKGROUND OF THE INVENTION

This invention relates to covers for use with solar panels and more particularly to covers for solar panels of the semiconductor type for converting solar radiation into electrical energy.

Solar panels, particularly of the type employing semiconductor phototransducers, must be maintained free of dust and other accumulations to operate efficiently. Foreign matter carried in the atmosphere can rapidly accumulate and reflect the incident light falling on the panel, preventing a portion of the radiation from being utilized. Frequent cleaning of panels is time-consuming and expensive and covering the panels during periods of darkness only slows, but does not prevent, the accumulations.

OBJECTS AND SUMMARY OF THE INVENTION

It is an object of the present invention to provide a solar panel cover assembly having a covering material which is movable to present clean covering material.

Another object of the invention is to provide a solar panel cover assembly which accomplishes the removal of efficiency-impairing accumulations of dust and other foreign matter.

Another object of the invention is to provide a solar panel cover assembly which is readily installed on existing solar panels.

Accordingly, a solar panel cover assembly is provided which includes a supply of film material transparent to radiation utilized by a solar panel. The cover assembly further includes means for positioning a portion of the supply of film material over the solar panel to cover and protect the solar panel, and includes means for moving the film material to present clean film material for covering the solar panel.

BRIEF DESCRIPTION OF THE DRAWINGS

FIG. 1 is a perspective view of a solar panel cover assembly according to the invention.

FIG. 2 is a side view in partial cross-section of the solar panel cover assembly of FIG. 1.

FIG. 3 is a top plan view of the solar panel cover assembly of FIGS. 1 and 2.

FIG. 4 is a perspective view of an alternative embodiment of the solar panel cover assembly of FIG. 1.

FIG. 5 is a side cross-sectional view of the solar panel cover assembly of FIG. 4.

FIG. 6 is an alternative embodiment of the solar panel cover assembly of FIG. 5.

DESCRIPTION OF THE PREFERRED EMBODIMENT

Referring to FIG. 1, a solar panel 10 is shown having an upper surface 12 for receiving solar radiation. It is contemplated that the invention will typically be employed with semiconductor-type solar panels formed of a plurality of phototransducers which convert the solar radiation into electrical energy. A first embodiment of a cover assembly for solar panel 10 is shown in FIGS. 1–3 and includes rollers 14 and 16 disposed along opposite sides of the panel. A supply of film material 18 is supported by the rollers. A portion of the supply is stored on first roller 14, and the film additionally extends over solar panel 10 to second roller 16. The film material 18 is transparent to the radiation utilized by solar panel 10, permitting the incident radiation to pass through and energize the panel. One suitable material for covering film 18 is transparent Mylar. Protective covers 21 and 22 surround rollers 14 and 16, respectively. Cover 21 includes a hinged door 23 and a slot 25 with an auxiliary roller 26 along its lower edge. Cover 22 includes a similar door 24, slot 28, and roller 30. Rollers 26 and 30 aid in positioning the portion of the film 18 which extends over panel 10.

In addition to the transparent film and means for positioning the film over panel 10, the invention includes means for moving film 18 to present clean film material for covering panel 10. Such means include a motor 32 connected through suitable gear reduction linkages to second roller 16. Motor 32 advances the film material from first roller 14 onto second roller 16 thereby continuously changing the film material covering panel 10.

The invention can be incorporated as an integral part of new solar panels or installed on pre-existing panels. In either case, the rollers 14 and 16 are placed along opposite sides of panels 10 whereby a portion of the film material extending between rollers 14 and 16 provides a protective cover for the panel.

In use, a supply of the transparent film is first installed on roller 14, which is accessed by way of cover 23 in housing 21. The film is then threaded through slot 25 and extended across receiving surface 12 of the panel 10 and through slot 28 to roller 16 in housing 22. Once in place, motor 32 pulls the film across the panel in the direction of arrow 34. The used film is collected on roller 16. The rate at which the film should be advanced is dependent on the dust conditions in the atmosphere. Ideally, clean film should be drawn over the panel rapidly enough to prevent impairment of its efficiency by accumulated foreign matter. For example, if twenty-four hours is required to accumulate sufficient matter to impair the efficiency of panel 10, the film should be advanced at a predetermined rate sufficient to replace the film covering the panel every twenty-four hours.

At or near the time the film on roller 14 is exhausted, the used film is removed from roller 16 through door 24 of housing 22. A new roll of film material is then installed on roller 14 and extended across panel 10, as described above. The used film material can be either cleaned or reused or otherwise disposed of.

Another embodiment of the invention is shown in FIGS. 4 and 5. In this embodiment, solar panel 10 is suitably supported by any conventional means in a suspended position. As before, upper surface 12 of the panel receives solar radiation. The cover assembly of this embodiment includes first and second rollers 40 and 42 adapted for installation along opposite sides of panel 10. A supply of film material 44 is supported by rollers 40 and 42. Film 44 extends over upper surface 12, covering and protecting panel 10, and also extends beneath the panel and around the rollers, forming a closed loop. As in the first embodiment, film 44 is formed of a material transparent to radiation utilized by panel 10, such as transparent Mylar or a suitable flexible plastic.

A housing 46 extends around the bottom of the unit, providing support for rollers 40 and 42. Housing 46 includes shield portions 52 and 54 attached to each end of the housing by hinges 55 and 56. Shields 52 and 54 extend over rollers 40 and 42 to help prevent foreign matter from entering the lower part of the housing. The shield portions swing back to expose rollers 40 and 42 for cleaning and servicing or for installation of a new film loop. One or both of the rollers 40 and 42 are provided with suitable tensioning means (not shown) for maintaining the tension on the loop of film 44. As in the first embodiment, means such as motor 60 are provided for moving film 44 in the direction of arrow 62. The film 44 can be installed over the rollers through provision of a seam which can be opened and reclosed or by another suitable means.

As shown in FIG. 5, cleaning means are provided along the loop in the form of a plurality of cleaning pads 64 in contact with film 44. The cleaning pads can be formed of a suitable fibrous material preferably impregnated with a cleaning solution which aids in removing foreign matter from film 44.

In use, the embodiment of FIGS. 4 and 5 functions in a manner similar to the first embodiment. Once film loop 44 is installed, motor 60 moves the film relative to panel 10 and cleaning means 64. The film is cleaned as it moves, presenting clean film material for covering upper surface 12 of the panel. The panel operates normally on light passing through film 44. The rate at which the film is advanced is determined exactly as in the first embodiment. Accumulated foreign matter is removed by cleaning pads 64, thereby assuring that clean film is advanced over the panel. Both the film and cleaning pads should be replaced periodically.

Another embodiment is shown in FIG. 6. This embodiment employs the same rollers and housing as shown in FIG. 4, but includes a different cleaning means in the lower part of the housing beneath panel 10. In the embodiment of FIG. 6, the cleaning means includes a reservoir in housing 46 for receiving liquid through which film 44 passes. The liquid 66 cleans film 44 as it passes through, thereby performing the same function as pads 64 in FIG. 5. Operation of the embodiment of FIG. 6 is the same as for that shown in FIG. 5.

The invention provides a cover assembly for a solar panel which protects the panel from dust and other foreign matter and removes all accumulations of such material automatically. The cover permits maximum operating efficiency for the solar panel. The self-cleaning feature has minimal power requirements. Furthermore, the invention is readily installed on existing solar panels.

Alternative embodiments are possible within the scope of the invention. For example, the rate at which the film is advanced over the panel can be varied according to dust and weather conditions. The film could also be advanced in discrete steps equal to the length of the panel, thereby replacing the entire covering upon signal from an operator or at predetermined intervals. The invention could also be employed on solar panels of other than semiconductor construction, such as water heating panels.

A cover assemby for a solar panel has been provided having a covering material which is movable to present clean covering material. The invention provides a cover assembly which accomplishes the removal of efficiency-impairing accumulations of dust and other foreigh matter. The invention additionally provides a cover assembly which is readily installed on existing solar panels.

What is claimed is:

1. In a solar panel assembly of the type including a solar panel having an upper surface for receiving solar radiation, the improvement comprising: first and second rollers disposed on opposite sides of said solar panel, a supply of film material in the form of a closed loop extending over said upper surface and also extending beneath said solar panel and around said rollers, said film material being transparent to radiation utilized by said solar panel, cleaning means disposed along said loop in contact with said film material for cleaning said film material, and means for moving said film material relative to said solar panel and said cleaning means thereby presenting clean film material for covering said upper surface of said solar panel.

2. A solar panel assembly as in claim 1 in which said cleaning means includes a reservoir for receiving liquid through which said film passes.

3. A solar panel assembly as in claim 1 in which said cleaning means includes a plurality of cleaning pads which contact said film material.

4. A solar panel assembly including solar panel means having a radiation receiving surface for converting solar radiation striking said radiation receiving surface into energy, the improvement comprising means for positioning a film material over said radiation receiving surface, a supply of film material supported by said means for positioning for covering said radiation receiving surface to protect against accumulations of foreign matter, and means for moving said film material to present clean film material for covering said radiation receiving surface whereby film covered with foreign matter which blocks incident solar radiation from reaching said radiation receiving surface is replaced.

5. A solar panel assembly as in claim 4 in which said means for positioning includes first and second rollers disposed along opposite sides of said solar panel means, said supply of film material being supported by said rollers.

6. A solar panel assembly as in claim 5 in which a portion of said supply of film material is stored on said first roller and another portion of said film material is extended across said radiation receiving surface and collected on said second roller.

7. A solar panel assembly as in claim 6 in which said means for moving said film material includes a motor connected to said second roller for turning said second roller to draw film material from said first roller across said radiation receiving surface onto said second roller.

8. A solar panel assembly as in claim 4 in which said film material is Mylar transparent to radiation utilized by said solar panel.

9. A solar panel assembly including solar panel means having a radiation receiving surface for converting solar radiation striking said radiation receiving surface into energy, the improvement comprising first and second rollers disposed on opposite sides of said radiation receiving surface, a supply of film material supported on said first and second rollers and extending over said radiation receiving surface to protect against accumulations of foreign matter on said radiation receiving surface, and means for advancing said film material from said first roller across said radiation receiving surface onto said second roller whereby film covered with accumulations of foreign matter which block incident solar radiation from reaching said radiation receiving surface is replaced.

10. A solar panel assembly as in claim 9 in which said means for advancing said film material continuously moves said film material from said first roller to said second roller at a predetermined rate.

11. A solar panel assembly as in claim 10 in which said film material is Mylar transparent to radiation utilized by said solar panel.

* * * * *